(12) United States Patent
Wang

(10) Patent No.: US 8,918,548 B2
(45) Date of Patent: Dec. 23, 2014

(54) SYSTEM METHOD FOR ACCESSORY ADAPTER WITH POWER SUPPLYING CAPABILITIES WHEREIN POWER CONDUCTIVE ELEMENT IS EITHER ACTIVE OR PASSIVE DEPENDING ON PLACEMENT OF ELECTRICAL CONTACTS

(71) Applicant: HTC Corporation, Taoyuan County (TW)

(72) Inventor: Chih-Kuang Wang, Taoyuan County (TW)

(73) Assignee: HTC Corporation, Taoyuan County (TW)

( * ) Notice: Subject to any disclaimer, the term of this patent is extended or adjusted under 35 U.S.C. 154(b) by 88 days.

(21) Appl. No.: 13/645,484

(22) Filed: Oct. 4, 2012

(65) Prior Publication Data

US 2014/0098491 A1 Apr. 10, 2014

(51) Int. Cl.
*G06F 13/00* (2006.01)
*H04B 5/00* (2006.01)

(52) U.S. Cl.
USPC ............... 710/16; 710/15; 710/17; 710/18; 710/19; 455/41.1; 361/679.56

(58) Field of Classification Search
USPC ...................................... 710/15–19; 455/41.1
See application file for complete search history.

(56) References Cited

U.S. PATENT DOCUMENTS

| 5,815,205 A | * | 9/1998 | Hashimoto et al. ............ 348/373 |
| 6,593,565 B2 | | 7/2003 | Heslin et al. |
| 6,894,510 B2 | | 5/2005 | Schmidt et al. |
| 7,222,198 B2 | * | 5/2007 | Stavely et al. .................. 710/33 |
| 7,463,904 B2 | * | 12/2008 | Bodnar et al. ............. 455/556.1 |
| 8,688,037 B2 | * | 4/2014 | Chatterjee et al. ........... 455/41.1 |
| 2010/0177476 A1 | * | 7/2010 | Hotelling et al. ........ 361/679.41 |

FOREIGN PATENT DOCUMENTS

TW 201220669 5/2012

OTHER PUBLICATIONS

"Office Action of Taiwan Counterpart Application", issued on Oct. 17, 2014, pp. 1-9.

* cited by examiner

*Primary Examiner* — Tammara Peyton
(74) *Attorney, Agent, or Firm* — Jiang Chyun IP Office

(57) ABSTRACT

An electronic device and an accessory are provided. The electronic device is installed on the accessory and identifies a type of the accessory. The electronic device includes a housing, a processor and an active sensing element. The processor and the active sensing element are disposed in the housing, and the active sensing element is electrically connected to the processor. The accessory includes a body and a passive sensing element, and the passive sensing element is disposed in the body. When the electronic device is installed on the accessory, the processor identifies the type of the accessory through that the active sensing element detects the passive sensing element, and the processor starts an operating mode relative to the accessory according to the type of the accessory. A method of operating an electronic device and an accessory is also provided.

10 Claims, 13 Drawing Sheets

SYSTEM METHOD FOR ACCESSORY ADAPTER WITH POWER SUPPLYING CAPABILITIES WHEREIN POWER CONDUCTIVE ELEMENT IS EITHER ACTIVE OR PASSIVE DEPENDING ON PLACEMENT OF ELECTRICAL CONTACTS

BACKGROUND

1. Field of the Application

The application is directed to an electronic device and an accessory thereof and more particularly, to an electronic device, an accessory and a method of operating the electronic device and the accessory.

2. Description of Related Art

With the continuous advancement and improvement of electronic technology in recent years, electronic devices such as mobile phones, tablet computers, notebook computers, smart phones or the like are extensively used and trend to develop to be convenient, multi-functioned and artistic designed so as to provide much more choices for customers. In addition to the functions provided with the electronic product itself, the electronic product may also be connected with different types of accessories, e.g. a speaker, to execute additional application programs, such as playing music, for improving usage of the electronic product.

Typically, the electronic product is electrically connected with an accessory through a transmission line, or through the wireless transmission technique, such as the radio frequency identification (RFID) technique or the Bluetooth technique for signal transmission. In such transmission techniques, a corresponding circuit has to be disposed on the accessory, such that the circuit of the accessory is driven by electric power or the wireless transmission of the electronic product and the electronic product can execute relative functions corresponding to the accessory. Thus, additional manufacturing cost requires to be spent on the circuit configured on the accessory.

SUMMARY

The application is directed to an electronic device capable of identifying a type of the accessory through a sensing technique.

The application is directed to an accessory enabling an electronic device to identify a type of the accessory through a sensing technique.

The application is directed to a method of operating an electronic device and an accessory, which is adopted by an electronic device to identify a type of the accessory and execute an application relative to the accessory through a sensing technique.

The application is directed to an electronic device adapted for being installed on an accessory and identifying a type of the accessory. The accessory includes a body and a passive sensing element. The passive sensing element is disposed in the body. The electronic device includes a housing, a processor and an active sensing element. The processor is disposed in the housing. The active sensing element is disposed in the housing and electrically connected with the processor. When the electronic device is installed on the accessory, the processor identifies the type of the accessory through the active sensing element detecting the passive sensing element and starts an operation mode corresponding to the accessory according to the type of the accessory.

The application is further directed to an accessory adapted for being connected with an electronic device and enabling the electronic device to identify a type of the accessory. The electronic device includes a housing, a processor and an active sensing element. The processor and the active sensing element are disposed in the housing. The active sensing element is electrically connected with the processor. The accessory includes a body and a passive sensing element. The passive sensing element is disposed in the body. When the accessory is connected with the electronic device, the processor identifies the type of the accessory through the active sensing element detecting the passive sensing element and starts an operation mode corresponding to the accessory according to the type of the accessory.

The application is further directed to a method of operating an electronic device and an accessory, which is adopted by the electronic device to identify a type of the accessory and execute an application relative to the accessory. The electronic device includes a housing, a processor and an active sensing element. The processor and the active sensing element are disposed in the housing. The active sensing element is electrically connected with the processor. The accessory includes a body and a passive sensing element. The passive sensing element is disposed in the body. The electronic device is installed on the accessory, and the active sensing element is adjacent to the passive sensing element. The operating method includes identifying the type of the accessory by the processor through the active sensing element detecting the passive sensing element and starting an operation mode corresponding to the accessory by the processor according to the type of the accessory.

To sum up, the application is directed to an electronic device, an accessory and a method of operating the same. The electronic device has an active sensing element. The accessory has a passive sensing element. When the electronic device is installed on the accessory, the active sensing element detects the passive sensing element. The processor of the electronic device identifies a type of the accessory according to the detection result and starts an operation mode corresponding to the accessory according to the type of the accessory. Accordingly, the electronic device identifies the type of the accessory through a sensing technique in replacement of the electrical connection of the electronic device with the accessory or the signal transmission through the wireless technique, and the cost spent on the circuit configuration on the accessory can be saved.

In order to make the aforementioned and other features and advantages of the application more comprehensible, several embodiments accompanied with figures are described in detail below.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

DESCRIPTION OF EMBODIMENTS

Figure 1:
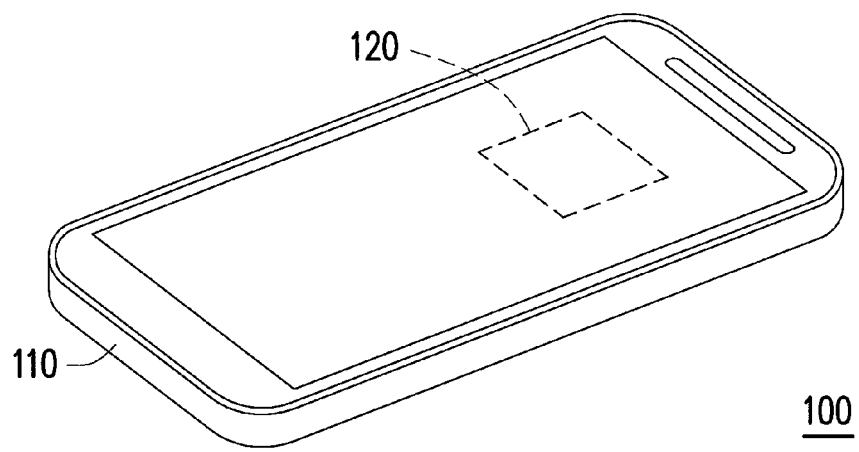
FIG. 1 is a three-dimensional (3D) diagram illustrating an electronic device according to an embodiment of the application.
Figure 2:
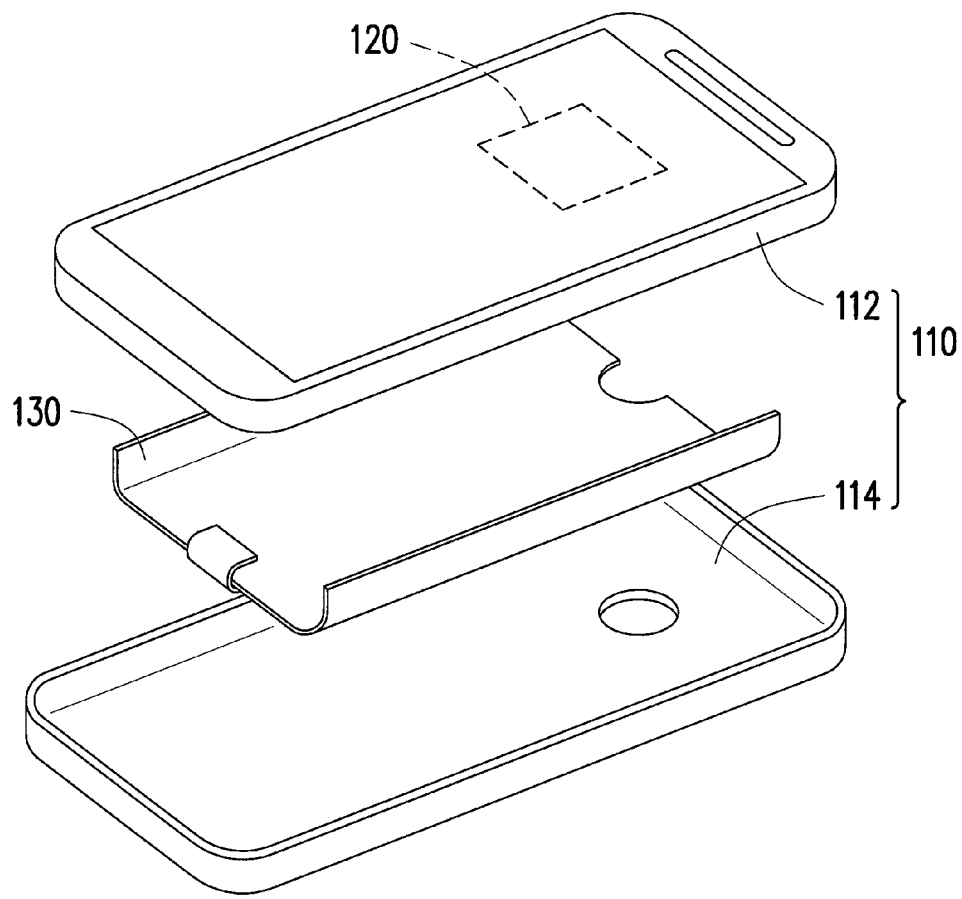
FIG. 2 is an exploded diagram of the electronic device illustrated in FIG. 1.

FIG. 1 is a three-dimensional (3D) diagram illustrating an electronic device according to an embodiment of the application. FIG. 2 is an exploded diagram of the electronic device illustrated in FIG. 1. Referring to FIG. 1 and FIG. 2, in the present embodiment, an electronic device 100 includes a housing 110, a processor 120 and active sensing element 130 (also referring to FIG. 2). The processor 120 and the active sensing element 130 are disposed in the housing 110 respectively, and the active sensing element 130 is electrically connected with the processor 120.

In the present embodiment, the housing 110 includes a kernel 112 and a back cover 114. The back cover 114 partially covers the kernel 112. The active sensing element 130 is disposed between the kernel 112 and the back cover 114. However, in other embodiments, the active sensing element 130 may be disposed at other places of the housing 110, for example, at a side of the housing 110, and the application is not limited thereto.

Figure 3A:
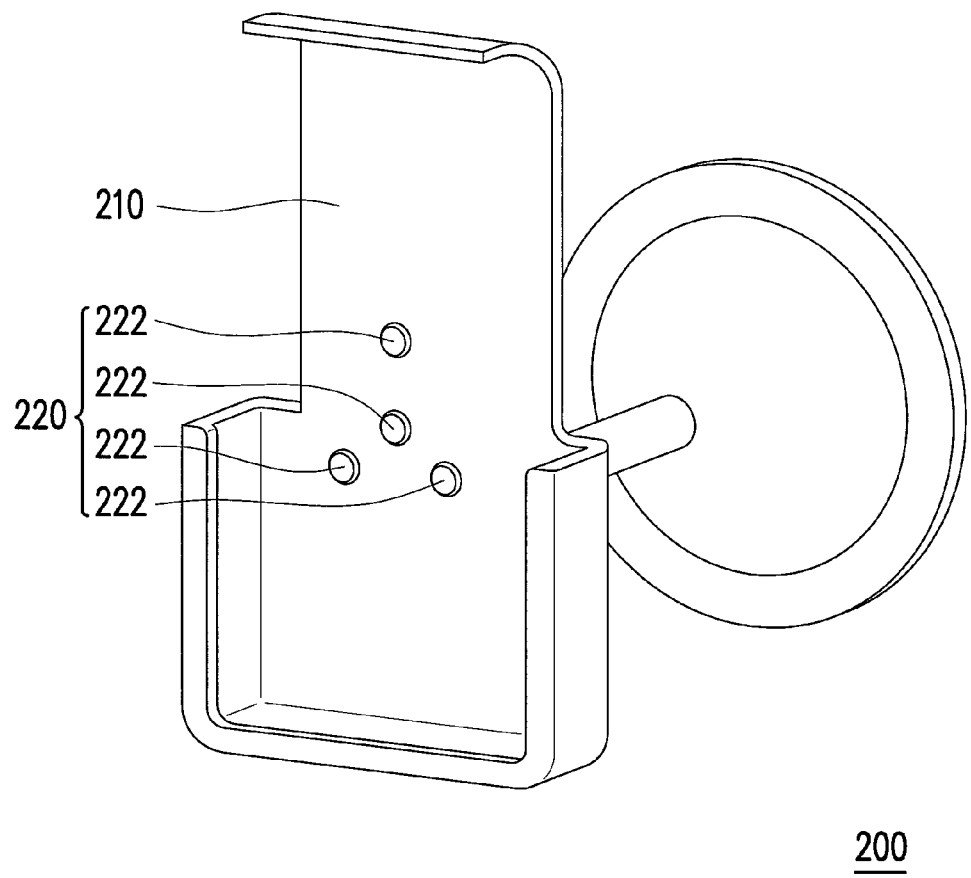
FIG. 3A is a 3D diagram illustrating an accessory according to a first embodiment of the application.
Figure 3B:
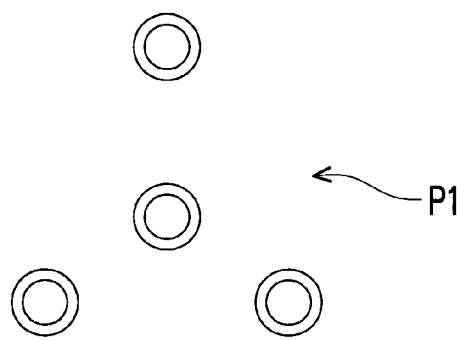
FIG. 3B is a schematic diagram of a sensing pattern illustrated in FIG. 3A.

FIG. 3A is a 3D diagram illustrating an accessory according to a first embodiment of the application. FIG. 3B is a schematic diagram of a sensing pattern illustrated in FIG. 3A. Referring to FIG. 3A and FIG. 3B, in the present embodiment, an accessory 200 includes a body 210 and a passive sensing element 220. The passive sensing element 220 is disposed in the body 210 without coupling to any power source element. When the accessory 200 is connected with the electronic device 100, the electronic device 100 is capable of identifying a type of the accessory 200.

In the present embodiment, the passive sensing element 220 has a plurality of dot-shaped sensing pads 222, and the dot-shaped sensing pads 222 are arranged as a sensing pattern P1, as shown in FIG. 3B. However, in other embodiments, the passive sensing element may include stripe-shaped sensing pads or sensing pads in any other shape to form the sensing pattern, and the application is not limited thereto. When the passive sensing element in other embodiments includes sensing pads in other shapes, a pattern formed in a shape arranged by the sensing pads themselves or arranged by sensing pads in different shapes may also be configured to identify the type of the accessory.

Figure 3C:
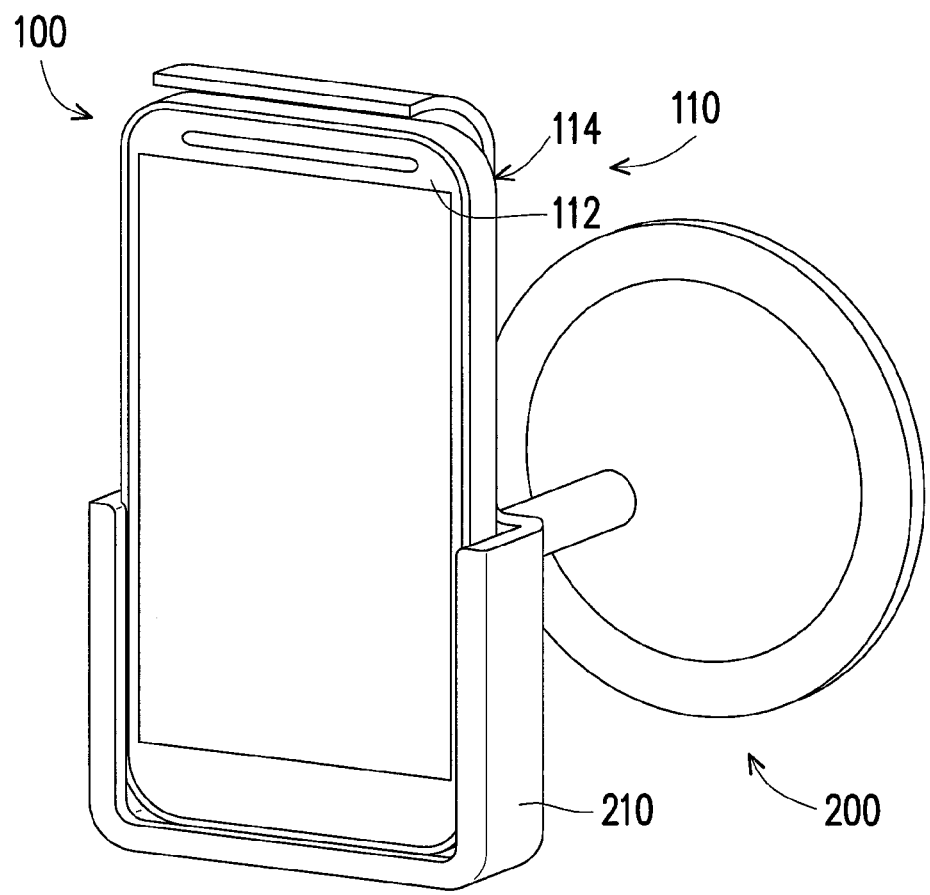
FIG. 3C is a 3D diagram of connecting the accessory illustrated in FIG. 3A with the electronic device.

FIG. 3C is a 3D diagram of connecting the accessory illustrated in FIG. 3A with the electronic device. Referring to FIG. 3A through FIG. 3C, in the present embodiment, when the electronic device 100 illustrated in FIG. 1 is installed on the accessory 200, the electronic device 100 is installed on the body 210 of the accessory 200 with the back cover 114 facing the accessory 200. Thus, the active sensing element 130 disposed between the kernel 112 and the back cover 114 faces the passive sensing element 220, so that the active sensing element 130 may detect the passive sensing element 220.

In detail, the active sensing element 130 detects the sensing pattern P1 arranged by the dot-shaped sensing pads 222 so that the processor 120 illustrated in FIG. 1 identifies the type of the accessory 200 according to the sensing pattern P1. In other words, the passive sensing element equipped in different types of accessories may have different sensing patterns. The active sensing element 130 may detect different sensing patterns of the passive sensing element, so that the processor 120 of the electronic device 100 may identify the type of the accessory.

In the present embodiment, the active sensing element 130 is a capacitive sensor, while the passive sensing element 220 is a conductive element, for example, including conductive dot-shaped sensing pads. Thus, when the electronic device 100 is installed on the accessory 200, the active sensing element 130 contacts the passive sensing element 220 so that a change of a capacitance is generated at a location of the active sensing element 130 corresponding to the dot-shaped sensing pads 222. Accordingly, the active sensing element 130 identifies the sensing pattern P1 of the passive sensing element 220 by the location where the change of the capacitance is generated.

On other hand, the processor 120 may have a database where sensing patterns relative to various types of accessories are stored. Thus, after the active sensing element 130 detects the sensing pattern P1 of the passive sensing element 220, the active sensing element 130 transfers a detection result to the processor 120, so that the processor 120 may identify the type of the accessory 200 by comparing the sensing pattern representing the detection result with the each of the sensing patterns stored in the database. After identifying the type of the accessory 200, the processor 120 may start an operation mode corresponding to the accessory 200 according to the type of the accessory 200.

Referring to FIG. 3C, in the present embodiment, the accessory 200 is a car kit. When the electronic device 100 is installed on the accessory 200, the active sensing element 130 detects the sensing pattern P1 of the passive sensing element 220 (as shown in FIG. 3B) so that the processor 120 identifies the type of the accessory 200 as a car kit. Accordingly, the processor 120 starts an operation mode, such as a navigation mode or a traffic broadcast mode, relative to the accessory 200 so that a user operates the electronic device 100 to execute an application function relative to the accessory 200 in the electronic device 100.

Figure 4A:
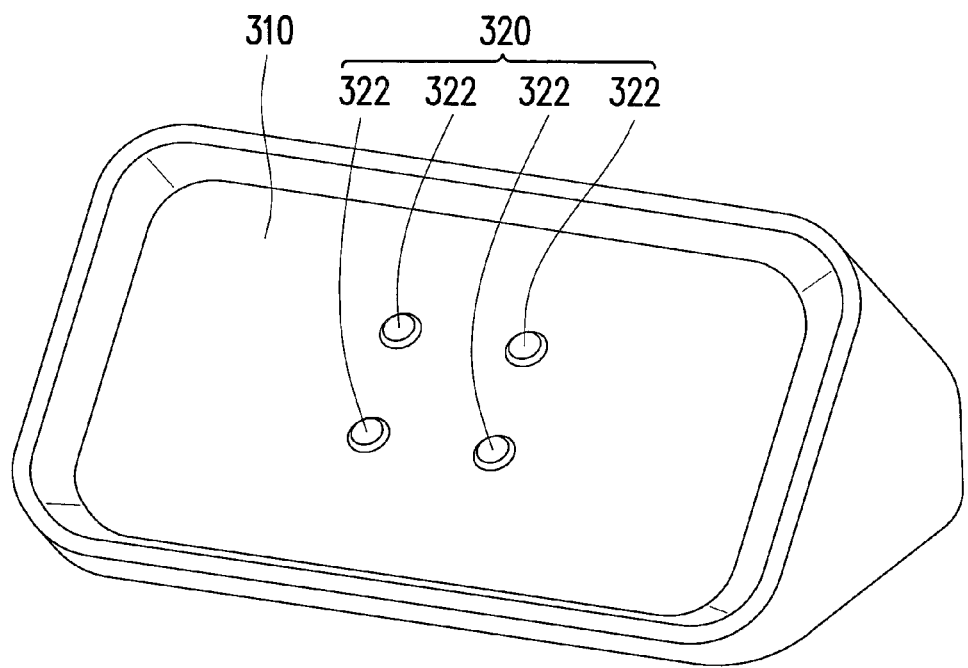
FIG. 4A is a 3D diagram illustrating an accessory according to a second embodiment of the application.
Figure 4B:
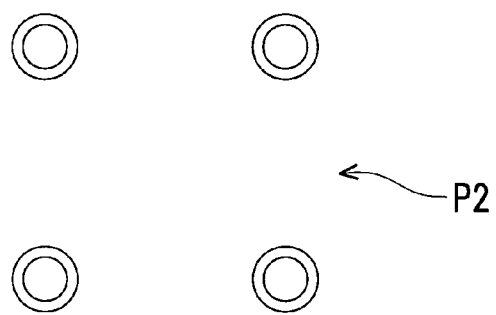
FIG. 4B is a schematic diagram of a sensing pattern illustrated in FIG. 4A.

FIG. 4A is a 3D diagram illustrating an accessory according to a second embodiment of the application. FIG. 4B is a schematic diagram of a sensing pattern illustrated in FIG. 4A. Referring to FIG. 4A and FIG. 4B, in the present embodiment, an accessory 300 includes a body 310 and a passive sensing element 320. The passive sensing element 320 is disposed in the body 310. The passive sensing element 320 has a plurality of dot-shaped sensing pads 322, and the dot-shaped sensing pads 322 are arranged as a sensing pattern P2, as shown in FIG. 4B.

Figure 4C:
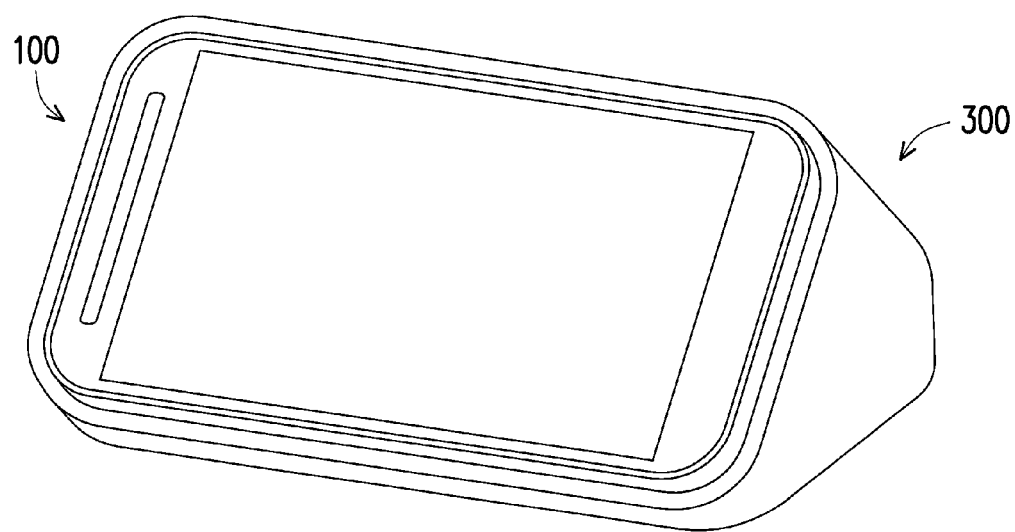
FIG. 4C is a 3D diagram of connecting the accessory illustrated in FIG. 4A with the electronic device.

FIG. 4C is a 3D diagram of connecting the accessory illustrated in FIG. 4A with the electronic device. Referring to FIG. 4A through FIG. 4C, in the present embodiment, when the electronic device 100 is installed on the accessory 300, the active sensing element 130 detects the sensing pattern P2 arranged by the dot-shaped sensing pads 322 so that the processor 120 identifies the type of the accessory 300 according to the sensing pattern P2. In other words, the sensing pattern P2 is different from the sensing pattern P1. Thus, the processor 120 of the electronic device 100 identifies that the type of the accessory 300 is different from the accessory 200 and starts an operation mode corresponding to the accessory 300.

Referring to FIG. 4C, in the present embodiment, the accessory 300 is a desk duck. When the electronic device 100 is installed on the accessory 300, the active sensing element 130 detects the sensing pattern P2 of the passive sensing element 320 so that the processor 120 identifies the type of the accessory 300 as a desk duck. Accordingly, the processor 120 starts an operation mode, such as a read mode, an audio and video play mode or an alarm clock mode, relative to the accessory 300 so that the user operates the electronic device 100 to execute an application function relative to the accessory 300 in the electronic device 100.

Figure 5A:
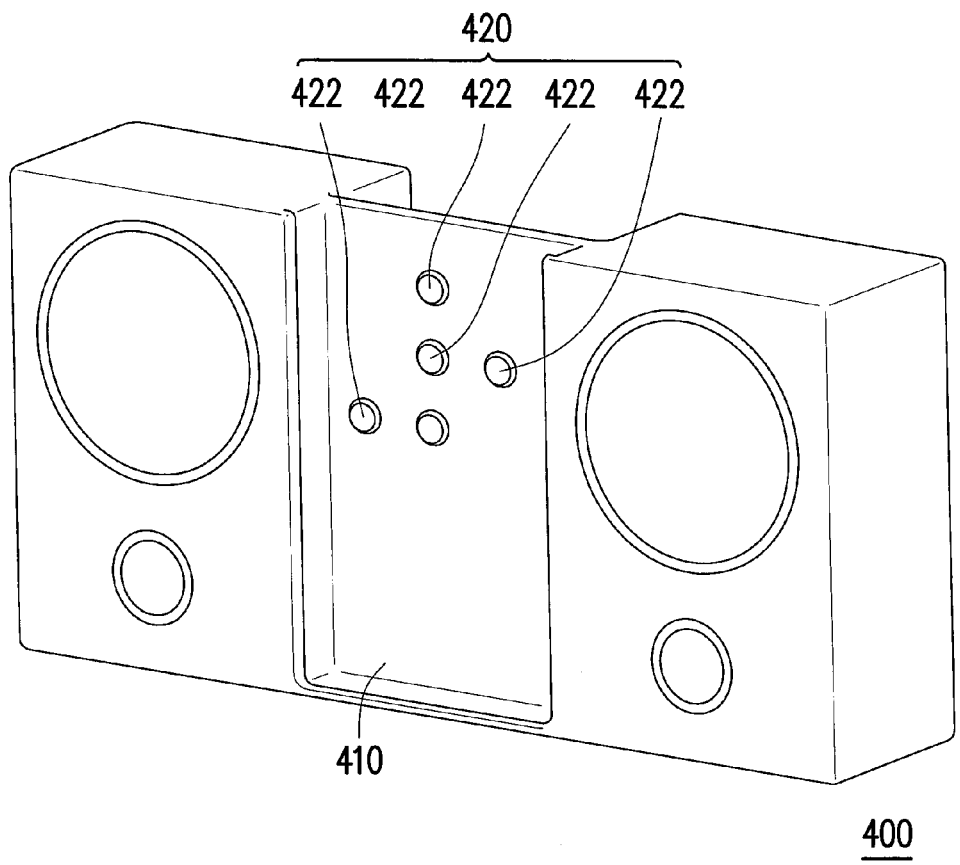
FIG. 5A is a 3D diagram illustrating an accessory according to a third embodiment of the application.
Figure 5B:
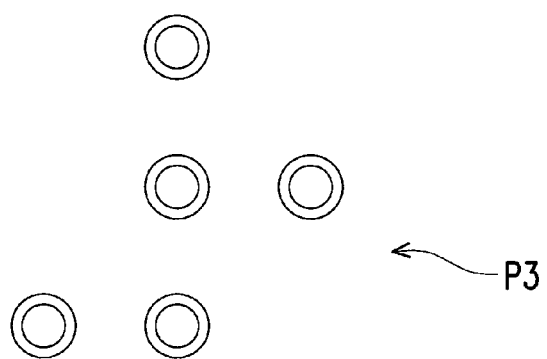
FIG. 5B is a schematic diagram of a sensing pattern illustrated in FIG. 5A.

FIG. 5A is a 3D diagram illustrating an accessory according to a third embodiment of the application. FIG. 5B is a schematic diagram of a sensing pattern illustrated in FIG. 5A. Referring to FIG. 5A and FIG. 5B, in the present embodiment, an accessory 400 includes a body 410 and a passive sensing element 420. The passive sensing element 420 is disposed in the body 410. The passive sensing element 420 has a plurality of dot-shaped sensing pads 422, and the dot-shaped sensing pads 422 are arranged as a sensing pattern P3, as shown in FIG. 5B.

Figure 5C:
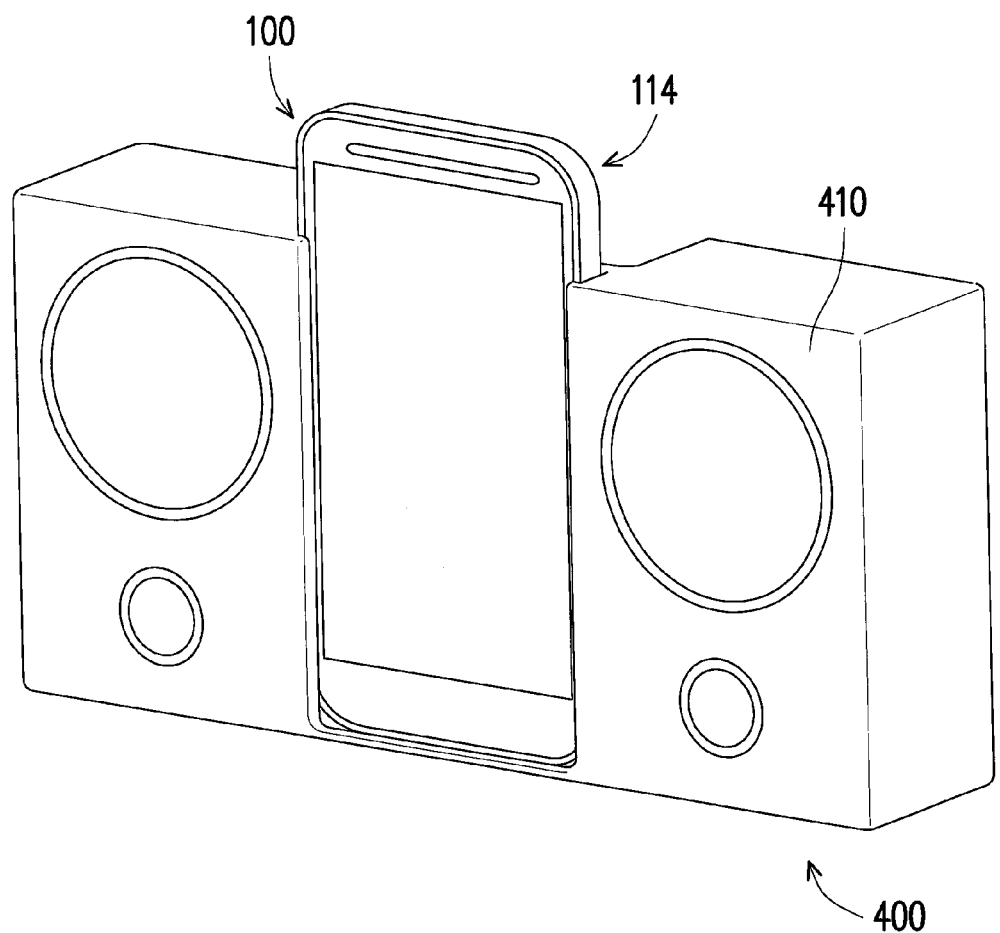
FIG. 5C is a 3D diagram of connecting the accessory illustrated in FIG. 5A with the electronic device.

FIG. 5C is a 3D diagram of connecting the accessory illustrated in FIG. 5A with the electronic device. Referring to FIG. 5A through FIG. 5C, in the present embodiment, when the electronic device 100 is installed on the accessory 400, the active sensing element 130 detects the sensing pattern P3 arranged by the dot-shaped sensing pads 422 so that the processor 120 identifies the type of the accessory 400 according to the sensing pattern P3. In other words, the sensing pattern P3 is different from the sensing pattern P1 and the sensing pattern P2. Thus, the processor 120 identifies that the type of the accessory 400 is different from the accessory 200 and the accessory 300 and starts an operation mode corresponding to the accessory 400.

Referring to FIG. 5C, in the present embodiment, the accessory 400 is a music duck. When the electronic device 100 is installed on the accessory 400, the active sensing element 130 detects the sensing pattern P3 of the passive sensing element 420 so that the processor 120 identifies the type of the accessory 400 as a music duck. Accordingly, the processor 120 starts an operation mode, such as a music play mode or a video play mode, relative to the accessory 400 so that the user operates the electronic device 100 to execute an application function relative to the accessory 400 in the electronic device 100.

Figure 6:
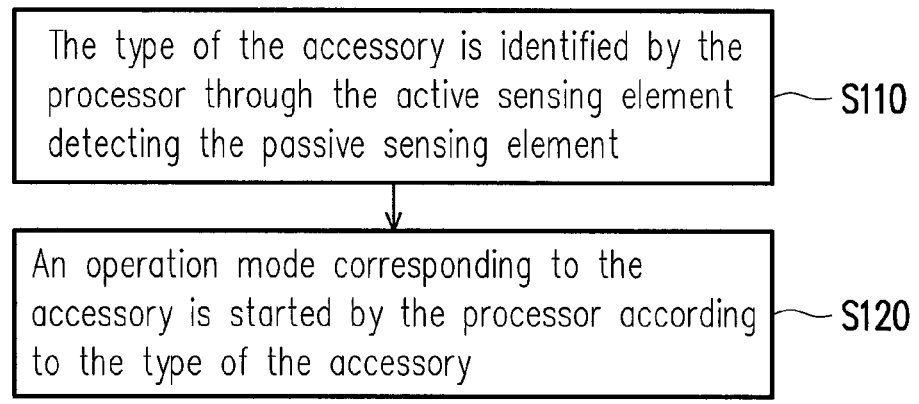
FIG. 6 is a flowchart of operating an electronic device and an accessory according to an embodiment of the application.

FIG. 6 is a flowchart of operating an electronic device and an accessory according to an embodiment of the application. Referring to FIG. 6, in the present embodiment, the electronic device is the aforementioned electronic device 100, and the accessory is the aforementioned accessory 200, accessory 300 or the accessory 400. The method of operating the electronic device and the accessory is adopted by the electronic device to identify the type of the accessory and execute an application corresponding to the accessory. In order to specifically describe the method of operating the electronic device and the accessory, the electronic device 100 and the accessory 400 of the third embodiment of the application are exemplarily illustrated herein. However, the user may also operate the electronic device 100 with the accessory 200 or the accessory 300 by the operating method.

In the present embodiment, the electronic device 100 is installed on the accessory 400, and the active sensing element 130 is adjacent to the passive sensing element 420. Referring to FIG. 5C, when the electronic device 100 is installed on the accessory 400, the back cover 114 of the electronic device 100 faces the body 410 of the accessory 400 so that the active sensing element 130 approaches the passive sensing element 420. Accordingly, the electronic device 100 and the accessory 400 are operated by this operating method.

The operating method of the present embodiment is described as follows. First, in step S110, the type of the accessory 400 is identified by the processor 120 through the active sensing element 130 detecting the passive sensing element 420. Specifically, after the electronic device 100 is installed on the accessory 400, the active sensing element 130 detects the sensing pattern P3 arranged by the dot-shaped sensing pads 422 so that the processor 120 identifies the type of the accessory 400 as the music duck based on the detection result.

Finally, in step S120, an operation mode corresponding to the accessory 400 is started by the processor 120 according to the type of the accessory 400. In particular, after identifying the type of the accessory 400, the processor 120 starts the operation mode, such as the music play mode or the audio and video play mode, relative to the accessory 400 according to the type of the accessory 400 so that the user operates the electronic device 100 to execute the application function relative to the accessory 400 in the electronic device 100. Accordingly, the user may operate the electronic device 100 and the accessory 400 by this operating method.

Figure 7A:
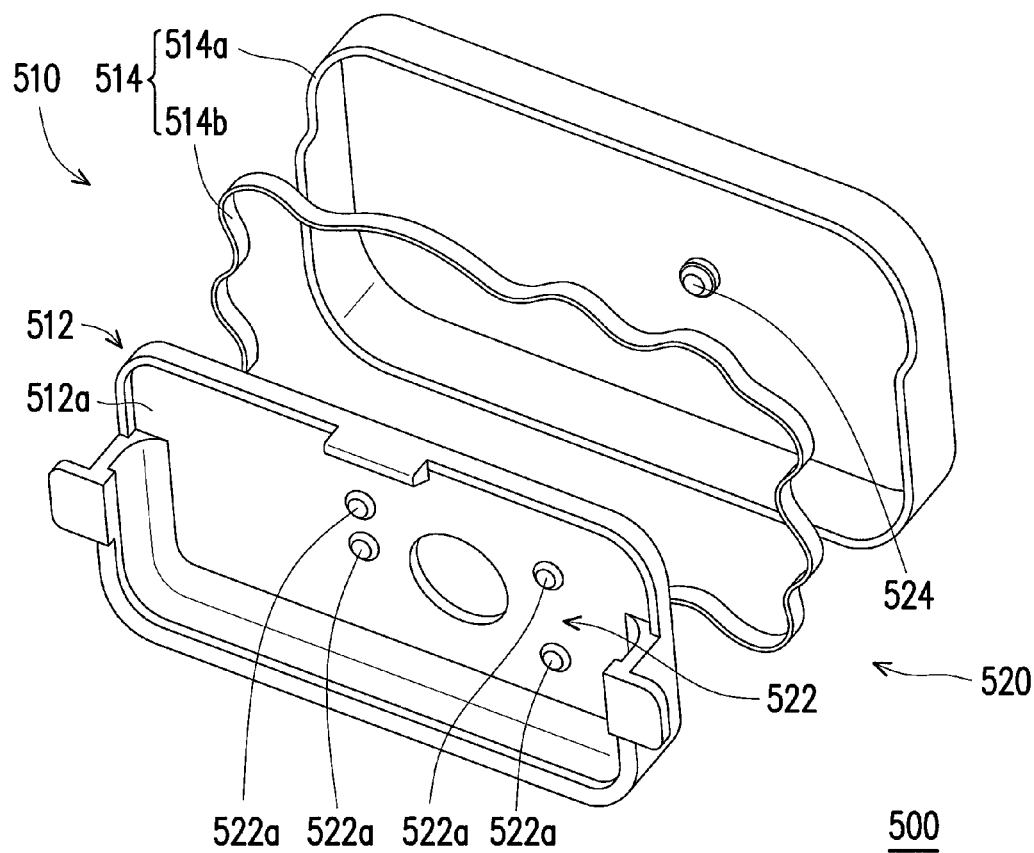
FIG. 7A is a 3D diagram illustrating an accessory according to a fourth embodiment of the application.
Figure 7B:
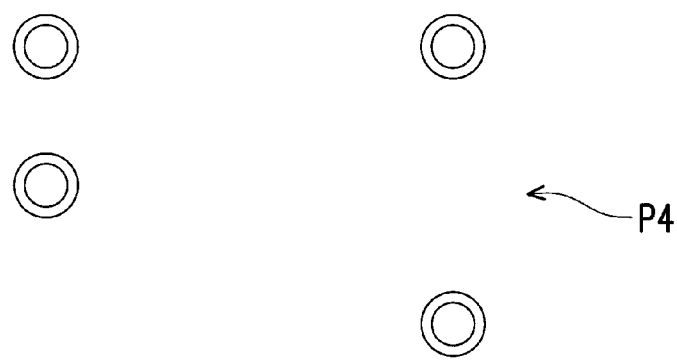
FIG. 7B is a schematic diagram of a fixed sensing pattern illustrated in FIG. 7A.

FIG. 7A is a 3D diagram illustrating an accessory according to a fourth embodiment of the application. FIG. 7B is a schematic diagram of a fixed sensing pattern illustrated in FIG. 7A. Referring to FIG. 7A and FIG. 7B, in the present embodiment, an accessory 500 includes a body 510 and a passive sensing element 520. The passive sensing element 520 is disposed in the body 510. When the accessory 500 is connected with the electronic device 100, the electronic device 100 identifies a type of the accessory 500.

In detail, with reference to FIG. 7A, the body 510 of the present embodiment includes a fixing portion 512 and a movable portion 514. The fixing portion 512 is connected with the movable portion 514 so that the movable portion 514 is movable relative to the fixing portion 512. In the present embodiment, fixing portion 512 includes a holder 512a. The movable portion 514 includes a movable cover 514a and a repositioning element 514b. The repositioning element 514b is, for example, an elastic element disposed between the holder 512a and the movable cover 514a so that the holder 512a moves relative to the movable cover 514a by pressing the repositioning element 514b.

On the other hand, the passive sensing element 520 includes a fixed sensing portion 522 and a movable sensing portion 524. The fixed sensing portion 522 is located on the holder 512a, and the movable sensing portion 524 is located on the movable cover 514a. In the present embodiment, the fixed sensing portion 522 includes a plurality of fixed dot-shaped sensing pads 522a, and the fixed dot-shaped sensing pads 522a are arranged as a fixed sensing pattern P4, as shown in FIG. 7B. However, in other embodiments, the fixed sensing portion 522 may be stripe-shaped sensing pads or sensing pads in any other shape, and the fixed sensing pattern P4 may be a pattern in a shape arranged by the sensing pads themselves or arranged by sensing pads in different shapes, and the application is not limited thereto.

Figure 7C:
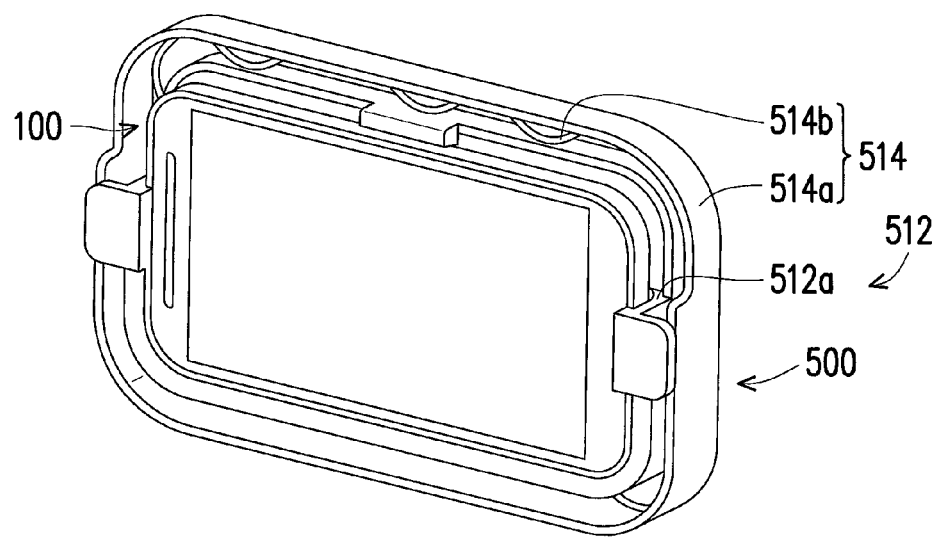
FIG. 7C is a 3D diagram of connecting the accessory illustrated in FIG. 7A with the electronic device.
Figure 7D:
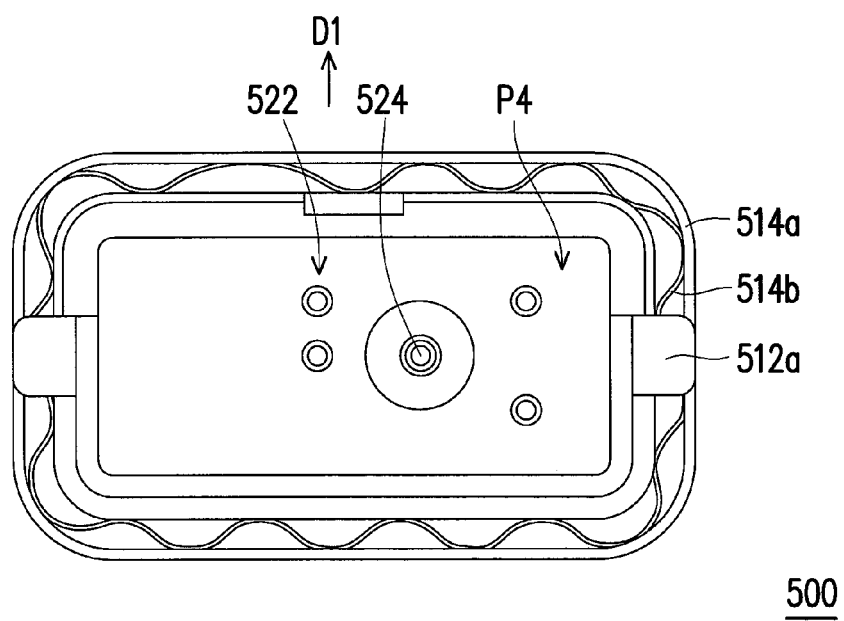
FIG. 7D is a top view of the accessory illustrated in FIG. 7A.

FIG. 7C is a 3D diagram of connecting the accessory illustrated in FIG. 7A with the electronic device. FIG. 7D is a top view of the accessory illustrated in FIG. 7A. Referring to FIG. 7A and FIG. 7D, in the present embodiment, the electronic device 100 is installed in the holder 512a of the body 510 so that the active sensing element 130 faces the fixed sensing portion 522 and the movable sensing portion 524 of the passive sensing element 520.

Referring to FIG. 7D, the active sensing element 130 detects the fixed sensing portion 522 so that the processor 120 identifies a type of the accessory 500 according to the fixed sensing pattern P4. Additionally, when the holder 512a moves relative to the movable cover 514a by pressing the repositioning element 514b, for example, the holder 512a is pushed and moves toward a direction D1, the movable sensing portion 524 located on the movable cover 514a moves relative to the active sensing element 130 of the electronic device 100 toward a direction in opposite to the direction D1. Thus, the active sensing element 130 generates a movable signal by detecting that the movable sensing portion 524 moves relative to the active sensing element 130.

Accordingly, after the active sensing element 130 detects the fixed sensing pattern P4, the active sensing element 130 transfers the detection result to the processor 120 so that the processor 120 identifies the type of the accessory 500 to start an operation mode corresponding to the accessory 500. In addition, after generating the movable signal, the active sensing element 130 transmits the movable signal to the processor 120 so that the processor 120 receives the movable signal so as to execute the operation function corresponding to the movable signal.

Figure 8A:
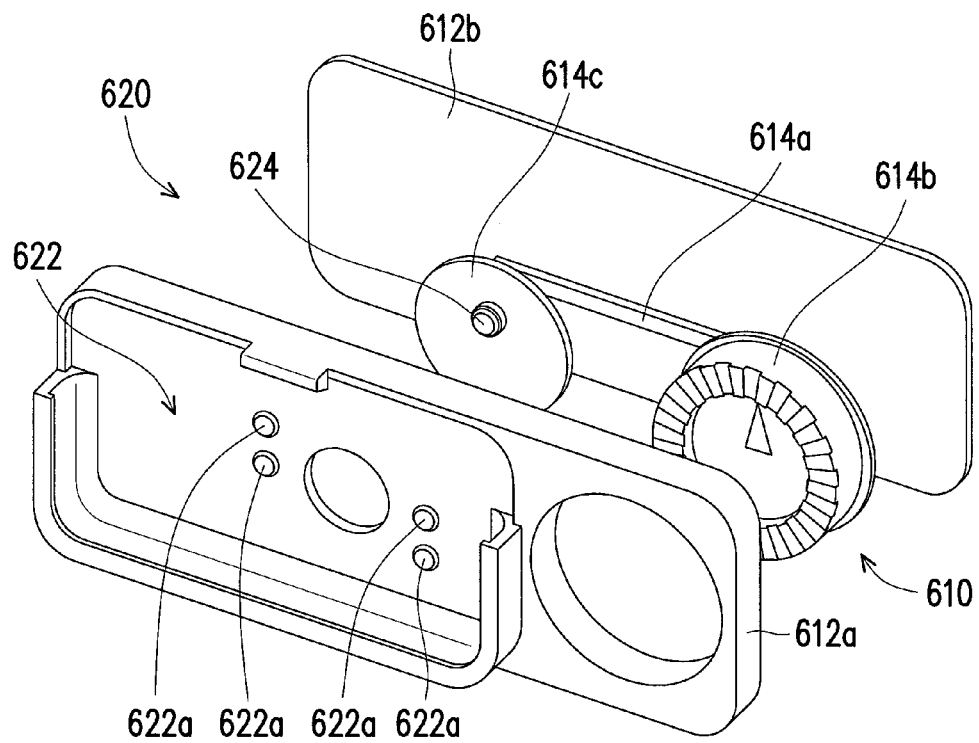
FIG. 8A is a 3D diagram illustrating an accessory according to a fifth embodiment of the application.
Figure 8B:
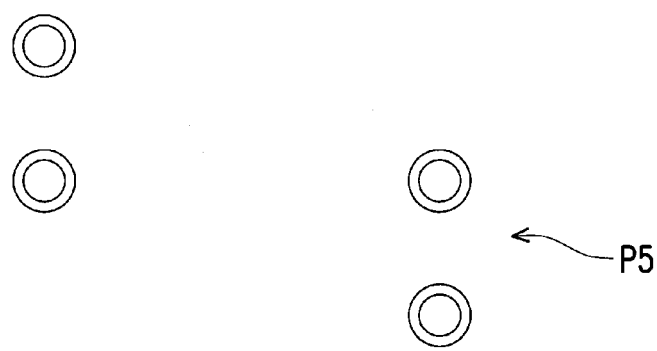
FIG. 8B is a schematic diagram of a fixed sensing pattern illustrated in FIG. 8A.

FIG. 8A is a 3D diagram illustrating an accessory according to a fifth embodiment of the application. FIG. 8B is a schematic diagram of a fixed sensing pattern illustrated in FIG. 8A. Referring to FIG. 8A and FIG. 8B, in the present embodiment, an accessory 600 includes a body 610 and a passive sensing element 620. The passive sensing element 620 is disposed in the body 610. The body 610 includes a fixing portion 612 and a movable portion 614. The fixing portion 612 is connected with the movable portion 614, and the movable portion 614 is movable relative to the fixing portion 612.

In the present embodiment, the fixing portion 612 includes a holder 612a and a back plate 612b. The movable portion 614 is located between the holder 612a and the back plate 612b. The movable portion 614 includes a linking rod 614a, a rotary wheel 614b and a rotary disc 614c. The rotary wheel 614b and the rotary disc 614c are individually pivoted to the holder 612a, and the linking rod 614a links to the rotary wheel 614b with the rotary disc 614c so that the rotary wheel 614b and the rotary disc 614c synchronously rotate with each other.

On the other hand, the passive sensing element 620 includes a fixed sensing portion 622 and a movable sensing portion 624. The fixed sensing portion 622 is located on the holder 612a. The movable sensing portion 624 is located on the rotary disc 614c. In the present embodiment, the fixed sensing portion 622 includes a plurality of fixed dot-shaped sensing pads 622a, and the fixed dot-shaped sensing pads 622a arranged as a fixed sensing pattern P5, as shown in FIG. 8B.

Figure 8C:
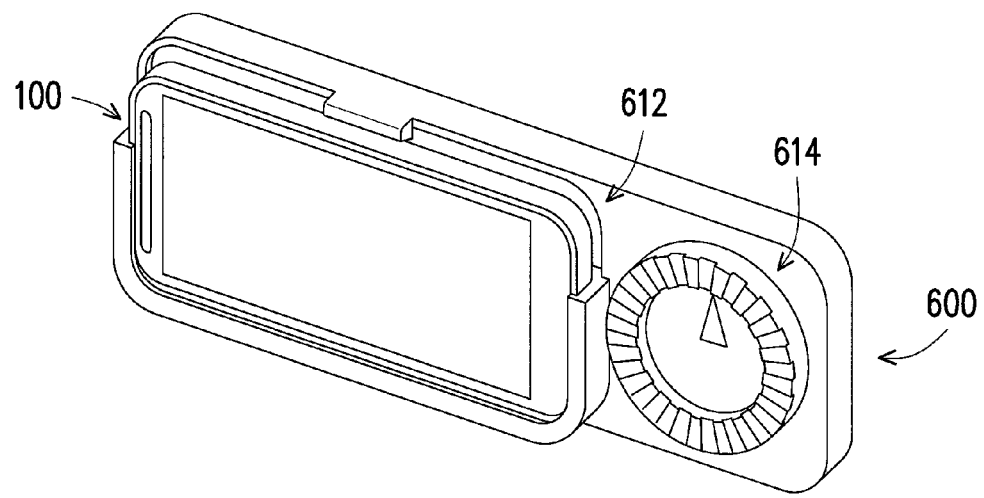
FIG. 8C is a 3D diagram of connecting the accessory illustrated in FIG. 8A with the electronic device.
Figure 8D:
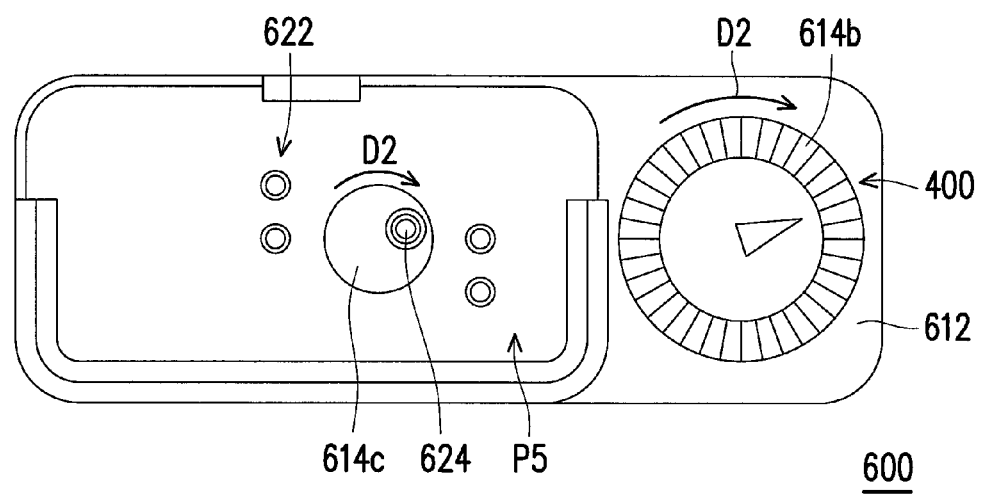
FIG. 8D is a top view of the accessory illustrated in FIG. 8A.

FIG. 8C is a 3D diagram of connecting the accessory illustrated in FIG. 8A with the electronic device. FIG. 8D is a top view of the accessory illustrated in FIG. 8A. Referring to FIG. 8A and FIG. 8D, in the present embodiment, the electronic device 100 installed in the holder 612a of the body 610 so that the active sensing element 130 faces the fixed sensing portion 622 and the movable sensing portion 624 of the passive sensing element 620.

With reference to FIG. 8D, the active sensing element 130 detects the fixed sensing portion 622 so that the processor 120 identifies a type of the accessory 600 according to the fixed sensing pattern P5. Additionally, when the rotary disc 614c rotates relative to the holder 612a with the rotation of the rotary wheel 614b toward a clockwise direction D2 and by being linked with the linking rod 614a, the movable sensing portion 624 located on the rotary disc 614c and the active sensing element 130 move relative to each other that the movable sensing portion 624 rotates toward the clockwise direction D2. Thereby, the active sensing element 130 detects that the movable sensing portion 624 moves relative to the active sensing element 130 so as to generate a movable signal.

Thus, after detecting the fixed sensing pattern P5, the active sensing element 130 transmits the detection result to the processor 120 so that the processor 120 identifies the type of the accessory 600 to start an operation mode corresponding to the accessory 600. Additionally, after generating the movable signal, the active sensing element 130 transmits the movable signal to the processor 120 so that the processor 120 receives the movable signal so as to execute an operation function corresponding to the movable signal.

Figure 9:
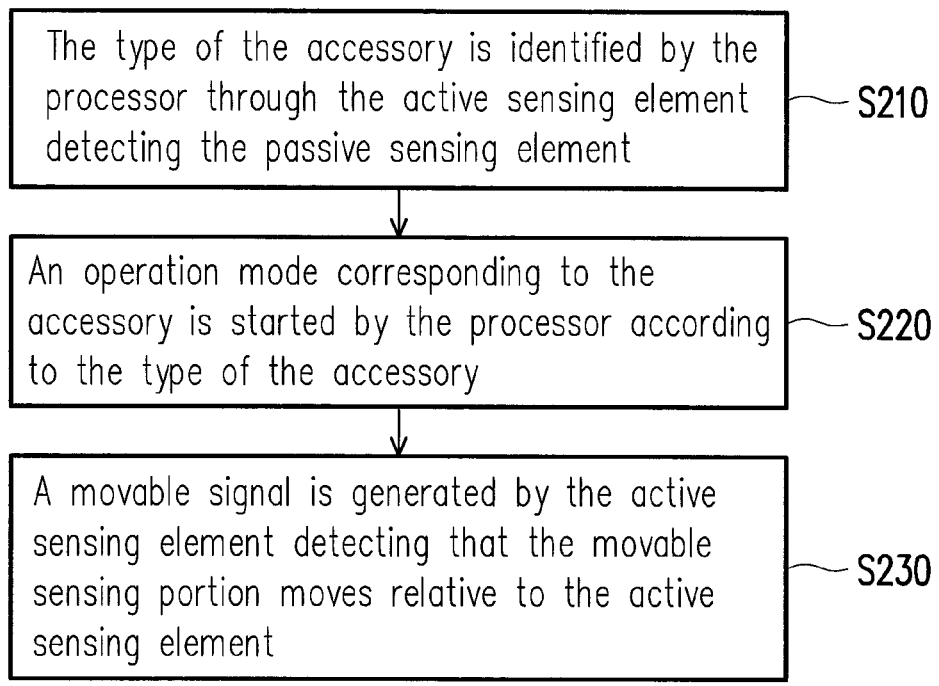
FIG. 9 is a flowchart of operating an electronic device and an accessory according to another embodiment of the application.

FIG. 9 is a flowchart of operating an electronic device and an accessory according to another embodiment of the application. With reference to FIG. 9, in the present embodiment, the electronic device is the aforementioned electronic device 100, and the accessory is the aforementioned accessory 500 or the accessory 600. The method of operating the electronic device and the accessory is adopted by the electronic device to identify a type of the accessory and execute an application corresponding to the accessory. In order to specifically illustrate the method of operating the electronic device and the accessory, the electronic device 100 and the accessory 600 of the fifth embodiment of the application are exemplarily illustrated herein. However, the user may also operate the electronic device 100 with the accessory 500 by this operating method.

In the present embodiment, the electronic device 100 is installed on the accessory 600, and the active sensing element 130 is adjacent to the passive sensing element 620. With reference to FIG. 8C, when the electronic device 100 is installed on the accessory 600, the back cover 114 of the electronic device 100 faces the holder 612a of the accessory 600 so that the active sensing element 130 approaches the passive sensing element 620. Additionally, the movable portion 614 may be movably connected with the fixing portion 612 so that the movable portion 614 is movable relative to the fixing portion 612. Accordingly, the electronic device 100 and the accessory 600 may be operated by the operation method.

On the other hand, in the present embodiment, the movable sensing portion 624 is movable relative to the active sensing element 130 through the movable portion 614 moving relative to the fixing portion 612. For example, after the electronic device 100 is installed on the accessory 600, the rotary disc 614c synchronously rotates relative to the holder 612a with the rotation of the rotary wheel 614b toward the clockwise direction D2 and by being linked with the linking rod 614a so that the movable sensing portion 624 located on the rotary disc 614c and the active sensing element 130 move relative to each other that the movable sensing portion 624 rotates toward the clockwise direction D2, as shown in FIG. 8D.

Accordingly, the operating method of the present embodiment is described as follows. First, in step S210, the type of the accessory 600 is identified by the processor 120 through the active sensing element 130 detecting the passive sensing element 620. After the electronic device 100 is installed on the accessory 600, the active sensing element 130 detects the fixed sensing pattern P5 arranged by the fixed dot-shaped sensing pads 622a so that the processor 120 identifies the type of the accessory 600 through the detection result.

Afterward, in step S220, an operation mode corresponding to the accessory 600 is started by the processor 120 according to the type of the accessory 600. Specifically, after identifying the type of the accessory 600, the processor 120 starts the operation mode corresponding to the accessory 600 according to the type of the accessory 600 so that the user operates the electronic device 100 to execute the application function corresponding to the accessory 600.

Finally, in step S230, a movable signal is generated by the active sensing element 130 detecting that the movable sensing portion 624 moves relative to the active sensing element 130. After the movable sensing portion 624 and the active sensing element 130 move relative to each other and the movable sensing portion 624 rotates toward the clockwise direction D2, the active sensing element 130 detects that the movable sensing portion 624 moves relative to the active sensing element 130 so as to generate the movable signal. The processor 120 receives the movable signal to execute the operational function corresponding to the movable signal. Accordingly, the user may operate the electronic device 100 with the accessory 600 through the operating method.

In the embodiment as describe above, the active sensing element is a capacitive sensor, and the passive sensing element is a conductive element. Thereby, the active sensing element detects the passive sensing element according to a change of a capacitance generated when contacting the passive sensing element. However, in other embodiments of the application, the active sensing element may be an electromagnetic sensor, and the passive sensing element is a magnetic element. Thus, the active sensing element detects the passive sensing element according to a change of a magnetic field when approaching the passive sensing element. At this time, the active sensing element may include a plurality of dot-shaped electromagnetic sensors, such as Hall sensors, and the passive sensing element may include a plurality of dot-shaped magnetic elements, such as magnets.

The electromagnetic sensors of the active sensing element are arranged as a sensing region, and the magnetic elements of the passive sensing element are arranged as a sensing pattern. Thus, according to the sensing region of the active sensing element, the passive sensing element selects positions corresponding to several of the electromagnetic sensors as a pattern change for disposing the magnetic elements. Thereby, the active sensing element may detect the passive sensing element according to the change of the magnetic field generated when approaching the passive sensing element so that the processor may identify the type of the accessory.

Based on the above, the application is directed to an electronic device, an accessory and a method of operating the same. The electronic device has an active sensing element. The accessory has a passive sensing element. When the electronic device is installed on the accessory, the active sensing element may detect the passive sensing element. According to the detection result, the processor of the electronic device may identify a type of the accessory and starts an operation mode corresponding to the accessory according to the type of the accessory. On the other hand, the accessory may have a fixing portion and a movable portion to enable the electronic device installed in the movable portion or the fixing portion to move relative to the other. The active sensing element generates a movable signal by detecting that the movable sensing portion moves relative to the active sensing element. The processor receives the movable signal to execute an operational function corresponding to the movable signal. Accordingly, the electronic device identifies the type of the accessory by a sensing technique in replacement of electrically connection of the electronic device and the accessory or the signal transmission through the wireless technique. As such, the cost spent on the circuit configuration on the accessory can be saved.

Although the application has been described with reference to the above embodiments, it will be apparent to one of the ordinary skill in the art that modifications to the described embodiment may be made without departing from the spirit of the application. Accordingly, the scope of the application will be defined by the attached claims not by the above detailed descriptions.

What is claimed is:

1. An accessory, adapted for being connected with an electronic device and enabling the electronic device to identify a type of the accessory, wherein the electronic device comprises a housing, a processor and an active sensing element, the processor and the active sensing element are disposed in the housing, and the active sensing element is electrically connected with the processor, the accessory comprising:
   a body, comprising a fixing portion and a movable portion, wherein the fixing portion is connected with the movable portion which is movable relative to the fixing portion, the electronic device is adapted for being installed in the fixing portion; and
   a passive sensing element, disposed on the body and comprising a fixed sensing portion and a movable sensing portion, wherein the fixed sensing portion is located on the fixing portion and comprising a sensing pattern, the movable sensing portion is located on the movable portion, when the accessory is connected with the electronic device, the processor identifies the type of the accessory according to the sensing pattern of the passive sensing element through the active sensing element detecting the sensing pattern of the passive sensing element and starts an operation mode corresponding to the accessory according to the type of the accessory, and the active sensing element generates a movable signal by detecting that the movable sensing portion moves relative to the active sensing element.

2. The accessory according to claim 1, wherein the passive sensing element comprises a plurality of dot-shaped sensing pads arranged into the sensing pattern, and the processor identifies the type of the accessory through the active sensing element detecting the sensing pattern.

3. The accessory according to claim 1, wherein the passive sensing element comprises a conductive element, and the active sensing element detects the passive sensing element according to a change of a capacitance generated when contacting the passive sensing element.

4. The accessory according to claim 1, wherein the passive sensing element comprises a magnetic element, and the active sensing element detects the passive sensing element according to a change of a magnetic field generated when approaching the passive sensing element.

5. The accessory according to claim 1, wherein the fixing portion comprises a holder, the movable portion comprises a movable cover and a repositioning element, the repositioning element is disposed between the holder and the movable cover, the movable sensing portion is located on the movable cover, the holder moves relative to the movable cover by pressing the repositioning element so as to enable the movable sensing portion and the active sensing element to move relative to each other.

6. The accessory according to claim 1, wherein the fixing portion comprises a holder, the movable portion comprises a linking rod, a rotary wheel and a rotary disc, the rotary wheel and the rotary disc are individually pivoted to the holder, the linking rod links the rotary wheel with the rotary disc to enable the rotary wheel and the rotary disc to synchronously rotate with each other, the movable sensing portion is located on the rotary disc, the rotary disc rotates relative to the holder with the rotation of the rotary wheel and by being linked with the linking rod so as to enable the movable sensing portion and the active sensing element to move relative to each other.

7. The accessory according to claim 1, wherein the fixed sensing portion comprises a plurality of fixed dot-shaped sensing pads arranged as the sensing pattern.

8. An method of operating an electronic device and an accessory, adopted by the electronic device to identify a type of the accessory and execute applications relative to the accessory, the electronic device comprising a housing, a processor and an active sensing element, wherein the processor and the active sensing element are disposed in the housing, and the active sensing element is electrically connected with the processor, and the accessory comprising a body and a passive sensing element disposed in the body, wherein the electronic device is installed on the accessory, the active sensing element is adjacent to the passive sensing element, the body of the accessory comprises a fixing portion and a movable portion, the passive sensing element comprises a fixed sensing portion and a movable sensing portion, the movable portion is movably connected with the fixing portion, the fixed sensing portion is located on the fixing portion and comprising a sensing pattern, and the movable sensing portion is located on the movable portion, wherein the movable sensing portion moves relative to the active sensing element through moving the movable portion relative to the fixing portion, and the operation method comprising:
    identifying the type of the accessory by the processor according to the sensing pattern of the passive sensing element through the active sensing element detecting the sensing pattern of the passive sensing element;
    starting an operation mode corresponding to the accessory by the processor according to the type of the accessory; and
    generating a movable signal by the active sensing element detecting that the movable sensing portion moves relative to the active sensing element.

9. The method of operating the electronic device and the accessory according to claim 8, wherein the passive sensing element comprises a plurality of dot-shaped sensing pads arranged into the sensing pattern, and the step of identifying the type of the accessory comprises identifying the type of the accessory by the processor through the active sensing element detecting the sensing pattern.

10. The method of operating the electronic device and the accessory according to claim 8, wherein the fixed sensing portion comprises a plurality of fixed dot-shaped sensing pads arranged into the sensing pattern, and the step of identifying the type of the accessory comprises identifying the type of the accessory by the processor through the active sensing element detecting the fixed sensing pattern.

\* \* \* \* \*